(12) United States Patent
Eickhoff et al.

(10) Patent No.: US 7,852,096 B2
(45) Date of Patent: Dec. 14, 2010

(54) SPRING-LOADED, REMOVABLE TEST FIXTURE FOR CIRCUIT BOARD TESTERS

(75) Inventors: Stuart Eickhoff, Plymouth, MN (US); Jon Hample, Plymouth, MN (US)

(73) Assignee: Circuit Check, Maple Grove, MN (US)

( * ) Notice: Subject to any disclaimer, the term of this patent is extended or adjusted under 35 U.S.C. 154(b) by 1817 days.

(21) Appl. No.: 10/874,410

(22) Filed: Jun. 22, 2004

(65) Prior Publication Data

US 2005/0270048 A1 Dec. 8, 2005

Related U.S. Application Data

(60) Provisional application No. 60/572,295, filed on May 18, 2004.

(51) Int. Cl.
*G01R 31/26* (2006.01)
(52) U.S. Cl. .................. 324/758; 324/158.1; 324/754
(58) Field of Classification Search ......... 324/754–762, 324/158.1, 73.1; 439/66–72, 482
See application file for complete search history.

(56) References Cited

U.S. PATENT DOCUMENTS

| | | | | | |
|---|---|---|---|---|---|
| 3,970,934 | A | * | 7/1976 | Aksu | 324/754 |
| 4,912,400 | A | * | 3/1990 | Plante | 324/754 |
| 5,214,374 | A | * | 5/1993 | St. Onge | 324/754 |
| 5,808,474 | A | * | 9/1998 | Hively et al. | 324/755 |
| 6,535,008 | B1 | | 3/2003 | Casale | |
| 6,900,648 | B2 | * | 5/2005 | Ou et al. | 324/755 |

\* cited by examiner

*Primary Examiner*—Vinh P Nguyen
(74) *Attorney, Agent, or Firm*—Altera Law Group, LLC

(57) ABSTRACT

A circuit board tester that uses an axial translation to bring a unit under test (UUT) into physical and electric contact with a series of electrical probes. The element on the tester that comes into contact with the UUT, on the side opposite the probes, is both spring-loaded and removable. For a first configuration in which a UUT has a heat sink, an internal heat sink snaps into the top of the tester. When the UUT is tested, the heat sink on the UUT contacts the internal heat sink and depresses it slightly into the top, under the influence of a spring-loaded support. For a second configuration in which the UUT has no heat sink, a block snaps into the top of the tester, and is spring-loaded through a series of receptacles to a module that contacts the UUT during operation.

13 Claims, 3 Drawing Sheets

SPRING-LOADED, REMOVABLE TEST FIXTURE FOR CIRCUIT BOARD TESTERS

CROSS-REFERENCE TO RELATED APPLICATIONS

This is a Non-Provisional (Utility) patent application of provisional application Ser. No. 60/572,295 filed May 18, 2004. The following applications are hereby incorporated by reference: Ser. No. 60/572,263 filed May 18, 2004 and 60/572,315 filed May 18, 2004.

STATEMENT REGARDING FEDERALLY SPONSORED RESEARCH OR DEVELOPMENT

Not Applicable

BACKGROUND OF THE INVENTION

1. Field of the Invention

The present invention is directed to circuit board testers, and more particularly to a spring-loaded, removable test fixture for circuit board testers.

2. Description of the Related Art

Circuit board testers are used for testing a variety of circuit boards or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency, phase and the like) are applied by the tester, typically under control of a computer, to certain of the probes. Some or all of the probes are used to measure the performance or response of the circuit board (i.e., to measure electrical parameters at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company. Even with the relatively rapid test procedures which can be achieved by in circuit testing, it is not unusual for desired testing of each circuit board to require on the order of 30 seconds to 90 seconds or more.

Generally, the tests are performed in the following sequence. First, a unit under test (UUT) is removably attached to a mechanical fixture on one side of the UUT, say, the top side. The bottom side of the UUT is left exposed, and contains the majority of the electrical circuitry to be tested. If the UUT contains a heat sink, the heat sink is generally located on the top side of the UUT, and there is generally clearance in the mechanical fixture to accommodate the heat sink, if required.

Once the UUT is rigidly attached to the fixture, the fixture is rigidly attached to the upper lid of the tester, often called a vacuum box. Before any tests are performed, the UUT is proximate, but not in contact with a series of electrical probes that are attached to a probe plate. The probe plate and probes are generally located beneath the UUT, on the side opposite the heat sink and opposite the vacuum box. The UUT and the electrical probes are then brought into contact by evacuating the region between the vacuum box and the probe plate, forcing the vacuum box and the probe plate toward each other due to atmospheric pressure. While the UUT and the electrical probes are in contact, the tester applies and measures a series of voltages and currents through the electrical probes at various locations on the UUT, in order to test the UUT's electrical characteristics and ensure proper performance. When the tests are completed, the vacuum is released, the UUT and the probes become spaced apart, and the UUT may be removed from the fixture.

The UUT may or may not contain its own heat sink, and the specific tests may or may not require that such a heat sink be removed during the test. Therefore, the circuit board testers are designed for (generally) one of two categories: (1) UUT with heat sink, and (2) UUT without heat sink.

For category (1), in which the UUT is tested with its heat sink attached, the tester should deliberately contain a mechanism for heat dissipation. (Recall that the testers generally operate in a near vacuum, which inhibits the effects of convection.) Typically, the tester has an interface that is brought into contact with the heat sink when the UUT is rigidly attached to the fixture. At the interface, the heat sink of the UUT is brought into thermal contact with a thermal conductor in the vacuum box lid, which generally directs heat through a port in the lid to a heat dissipater located outside the tester, nominally at room temperature and pressure. The tester interface is permanently attached to the vacuum box lid, and is typically designed to accommodate only one dimension of heat sink.

If the height of the heat sink changes in a future revision of the UUT, the thermal interface should be retooled. Furthermore, part-to-part variations in the heat sink height may cause problems during testing. If the heat sink on the UUT is too tall, it may lead to mechanical damage to the UUT or to the tester. If the heat sink on the UUT is too short, it may lead to poor (or no) thermal contact and, subsequently, poor test results. Accordingly, it would be beneficial to have a configuration in which the thermal interface is spring-loaded, in order to accommodate part-to-part variations in UUT heat sink height. It would also be beneficial to have a removable configuration, in which the thermal interface may be readily swapped out, in order to accommodate any design changes for the heat sink height.

For category (2), in which the heat sink is absent from the UUT, the tester generally does not provide for heat dissipation. Instead, the tester may perform additional electrical tests on the side of the UUT opposite the probe plate. Generally, these additional tests are not as rigorous as those performed by the electrical probes, and the function of many of the additional electrical tests is to check the performance of some of the discrete components mounted on the circuit board, such as a capacitance measurement for discretely mounted capacitors, and so on. There exist several off-the-shelf modules that assist in these measurements, such as the TestJet Assembly, manufactured by Hewlett-Packard. The module is held rigidly against the top side of the UUT (opposite the probe plate) by a series of receptacles. The receptacles affix the module to the vacuum box, and are generally spring-loaded, but not adjustable or removable. The module is electrically connected via the receptacles through a port in the vacuum box to an electrical contact pin, which in turn is connected to controlling circuitry external to the vacuum box.

As with category (1), any height variations in the UUT may cause improper test results or damage to the tester. Accordingly, it would be beneficial to have a spring-loaded, removable interface at the vacuum box, both for the thermal interface of category (1) and for the electrical interface of category (2).

BRIEF SUMMARY OF THE INVENTION

A present embodiment is a test jet for use in a circuit tester, the circuit tester having a top with a receiving mount therein, a bed for a circuit board under test, the test jet intended to contact at least one component on a circuit board on the bed, the test jet comprising: a) a mounting element sized to be releasably received within said tester mount; b) a contact element intended to contact at least one component on said circuit board when under test; c) length adjustable linkage capable of altering the distance between said contact element and said mounting element so that said contact element intimately engages said component when the unit is under test irrespective of the height of said component.

A further embodiment is a test jet for use in a circuit tester, the circuit tester having a top with a receiving mount therein to receive a portion of the test jet, a bed for a circuit board under test, the test jet having a mount engaging plate, a circuit component engaging plate and linkage therebetween, said circuit component engaging plate intended to intimately contact at least one component; the improvement comprising linkages being compressibly resilient, so that distance between said mounting and engaging plates may adjust in response to variable heights of components on said circuit board.

A further embodiment is a test jet for use in a circuit tester, the circuit tester having a top with a receiving mount therein, a bed for a circuit board under test, the test jet intended to contact at least one component on a circuit board on the bed, the test jet comprising: a) a mounting element sized to be releasably received within said tester mount and to contact at least one component on said circuit board when under test; b) length adjustable linkage capable of altering the distance between said mounting element and the top so that, said mounting element intimately engages said component when the unit is under test irrespective of the height of said component.

A further embodiment is a method of reliably making intimate contact with circuit elements of varying height on a plurality of circuit boards under test comprising steps of: a) providing a plurality of test jet units corresponding to heights needed to accommodate varying circuit elements; b) selecting the appropriate unit to match the available height of each circuit board elements; and c) engaging said test jet unit with said circuit board element.

DETAILED DESCRIPTION OF THE INVENTION

In a manufacturing environment for circuit boards, a final test is often an electrical test, to ensure that each circuit board performs as required. Such tests are well-known in the industry, and may be performed by commercially available testers, such as Agilent Model 3070.

Figure 1:
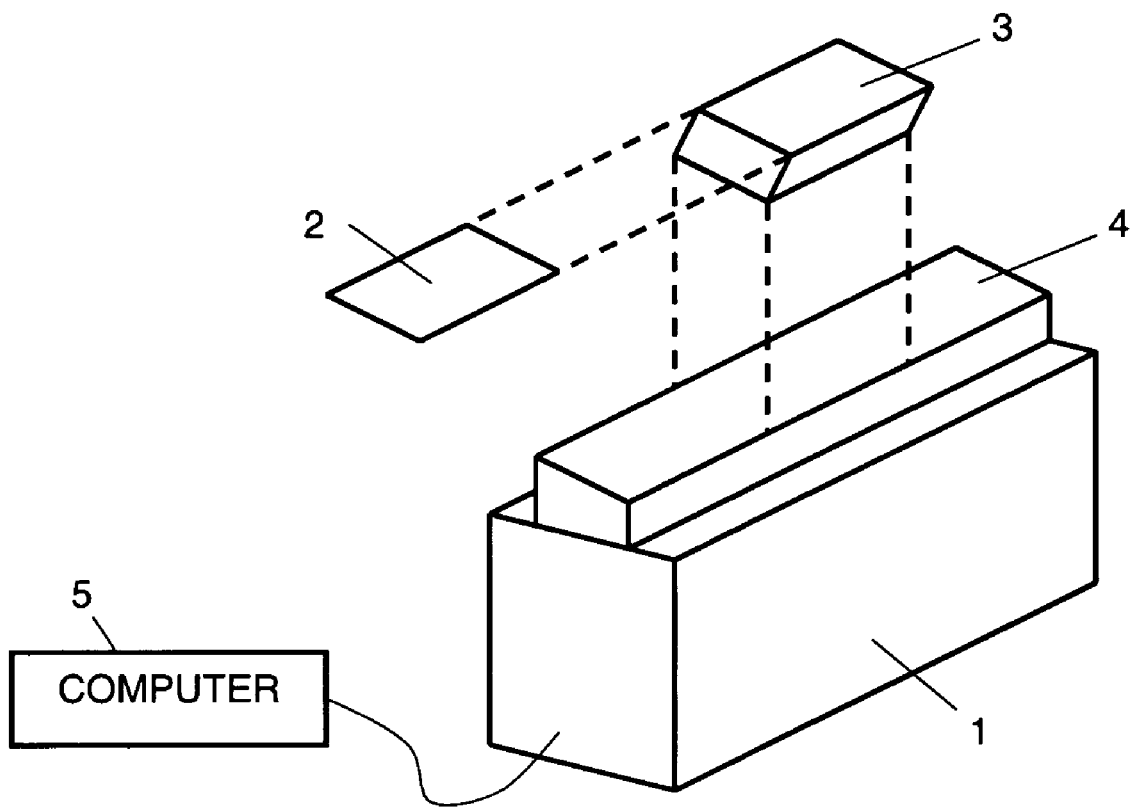
FIG. 1 is a schematic diagram of a circuit board tester.

A basic schematic of a circuit board tester 1 is shown in FIG. 1. A circuit board, often referred to as a unit under test (UUT) 2, is mounted on a fixture 3 for the duration of the test, which provides a rugged mechanical mount for the UUT as well as a mechanical interface with other components in the tester 1. The fixture 3 is positioned on a bed 4, so that various electrical probes may make contact with specific locations on the UUT 2 and perform the desired tests. The probes may apply and measure voltages or currents at various locations on the UUT 2, and are controlled mechanically and electrically by the tester 1. A computer 5 may control the tester 1 and may record data from the tests.

The UUT 2 may or may not contain its own heat sink, and the specific tests may or may not require that such a heat sink be removed during the test. Therefore, the circuit board testers are designed for generally one of two categories: (1) UUT 2 with heat sink, and (2) UUT 2 without heat sink. These two categories are treated separately in FIGS. 2 and 3.

Figure 2:
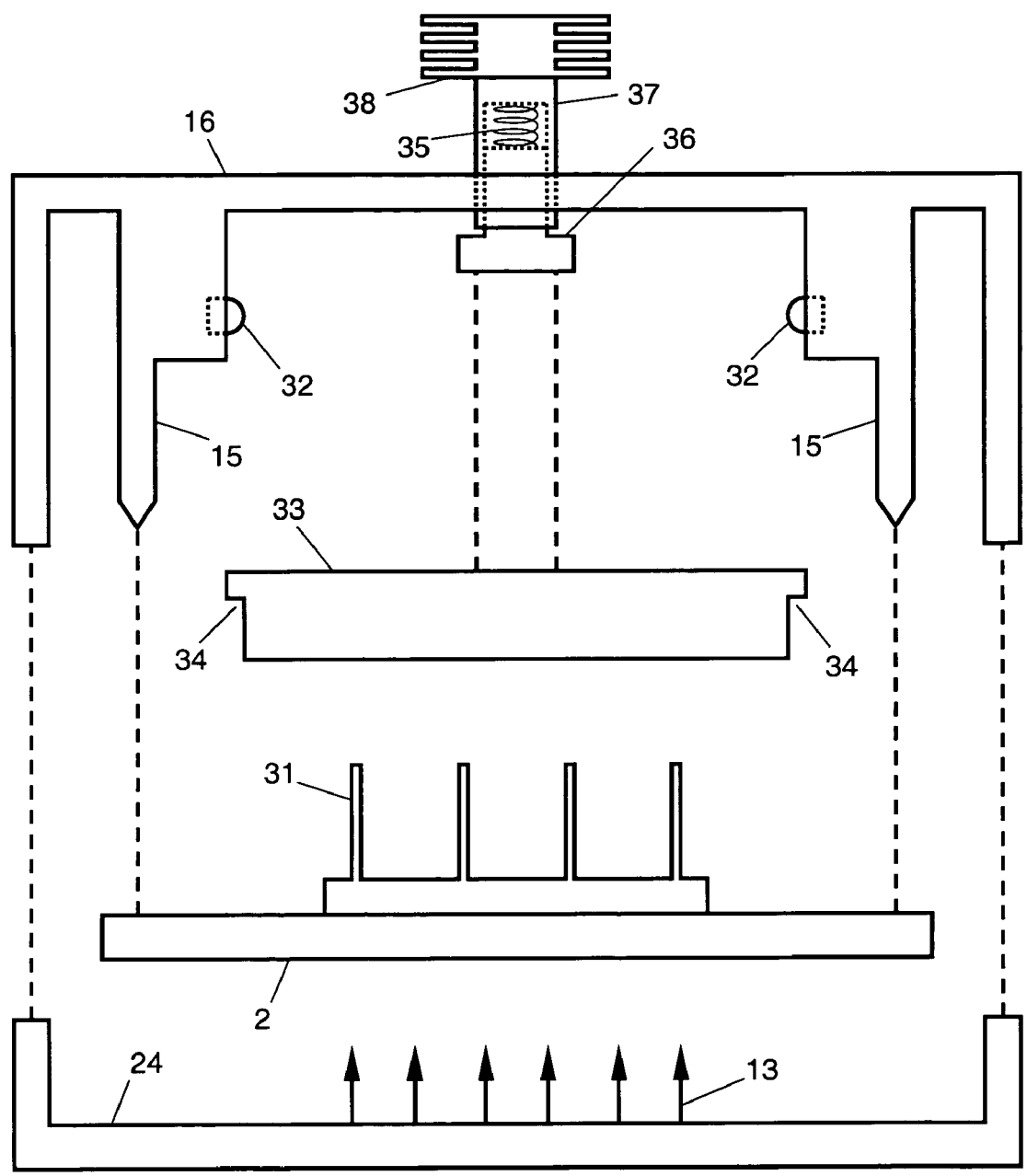
FIG. 2 illustrates a mechanical system for a circuit tester, for use with a unit under test with a heat sink.

FIG. 2 shows a basic schematic of a mechanical system for a circuit tester, for use with a UUT 2 with a heat sink 31.

Initially, before any tests are performed, an internal heat sink, or contact element, 33 is removably attached to a vacuum box, or top, 16. The dimensions of the internal heat sink 33 are such that the internal heat sink 33 makes reliable contact with the heat sink 31 on the UUT 2, without damaging any components on the UUT 2 or the tester 1. If a particular part to be tested is unusually tall (so that it would damage the tester) or unusually short (so that it would not make good contact with the internal heat sink 33), then the internal heat sink 33 may be swapped out for one with of a different size that may accommodate the unusually-sized part under test. Note that the internal heat sinks 33 are removable, which is an important distinction of the present embodiment over the prior art (which uses fixed internal heat sinks that are rigidly attached to the vacuum box 16).

The vacuum box 16 contains a plurality of ball detents 32 in its interior. An internal heat sink 33 contains a plurality of notches 34, and may be removably affixed to the vacuum box 16 by engaging the ball detents 32 in the notches 34. When the internal heat sink 33 is affixed to the vacuum box 16, a spring 35 is compressed slightly, forcing a floating stud 36 into mechanical and thermal contact with the internal heat sink 33. If a part under test is slightly too large, the internal heat sink 33 may further compress the spring 35 and remain in good contact with the part, without damaging either the part or the tester components. Note that the internal heat sinks 33 are spring-loaded, which is a further distinction of the present embodiment over the prior art.

Although FIG. 2 shows the internal heat sink 33 fastened to the vacuum box 16 by a series of ball detents 32 and notches 34, it will be appreciated that other fastening methods may be used, such as a series of push-and-turn notches, threads, or clips. One skilled in the art will readily appreciate that any suitable fastening method may be employed, provided that once fastened to the vacuum box 16, the internal heat sink 33 is prevented from moving away from the vacuum box 16, and the internal heat sink 33 may be further moved toward the vacuum box 16 by compressing the spring 35.

Additionally, although FIG. 2 shows a spring 35 providing a resisting force between vacuum box 16 and the internal heat sink 33, it will be appreciated that any suitable device may be used to maintain a resisting force between the vacuum box 16 and the internal heat sink 33, such as a spring in tension or compression, a pressure washer, an elastic material, or a compressible or expandable material, such as a foam.

The floating stud 36 is in thermal contact with a heat sink bolt 37 that is rigidly attached to and protrudes through the vacuum box 16. The heat sink bolt 37 is attached to a finned radiator, or heat radiator, 38, located outside the vacuum box 16. The internal heat sink 33, the floating stud 36, the heat sink bolt 37 and the finned radiator 38 are all thermally conductive, and are preferably fabricated from a metal such as aluminum or copper. When the internal heat sink 33 is attached to the vacuum box 16, any excess heat generated during the test flows out of the vacuum box 16 to the finned radiator 38 and is dissipated into the atmosphere. (Note that inside the vacuum box, the tests are performed in a near-vacuum, which inhibits the effects of convection.)

Once the internal heat sink 33 is attached to the vacuum box 16, it generally remains attached over the course of many tests, until a particular UUT 2 comes through that is too large or too small to be accommodated by the particular internal heat sink 33. (When that happens, the internal heat sink 33 may be swapped out for one of a different size.)

Once an internal heat sink 33 of a suitable dimension is attached to the vacuum box, a UUT 2 may be tested. To perform a series of tests, a UUT 2 and its heat sink 31 are removably attached to a plurality of fingers 15. The heat sink 31 is brought into physical and thermal contact with the internal heat sink 33, and good contact is maintained throughout the test by the spring 35, which is additionally compressed when the UUT 2 is attached to the fingers 15. Once the UUT 2 and its heat sink 31 are attached to the fingers 15, the vacuum box 16 is evacuated by a vacuum system, and the various probes 13 on the probe plate 24 are brought into electric and mechanical contact with the UUT 2. The tests are performed, the vacuum is released, the vacuum box 16 and probe plate 24 separate, the probes 13 become spaced apart from the UUT 2, and the UUT 2 and its attached heat sink 31 may be removed. The use of a vacuum system to bring the probes 13 into contact with the UUT 2 is well known in the art, and is not further described here.

For the embodiment of FIG. 2, in which the UUT 2 is attached to a heat sink 31, the fixture 3 (of FIG. 1) includes the vacuum box 16, the fingers 15, the ball detents 32, the internal heat sink 33, the floating stud 36, the spring 35, the heat sink bolt 37 and the finned radiator 38. The bed 4 (of FIG. 1) includes the probe plate 24 and the probes 13.

Figure 3:
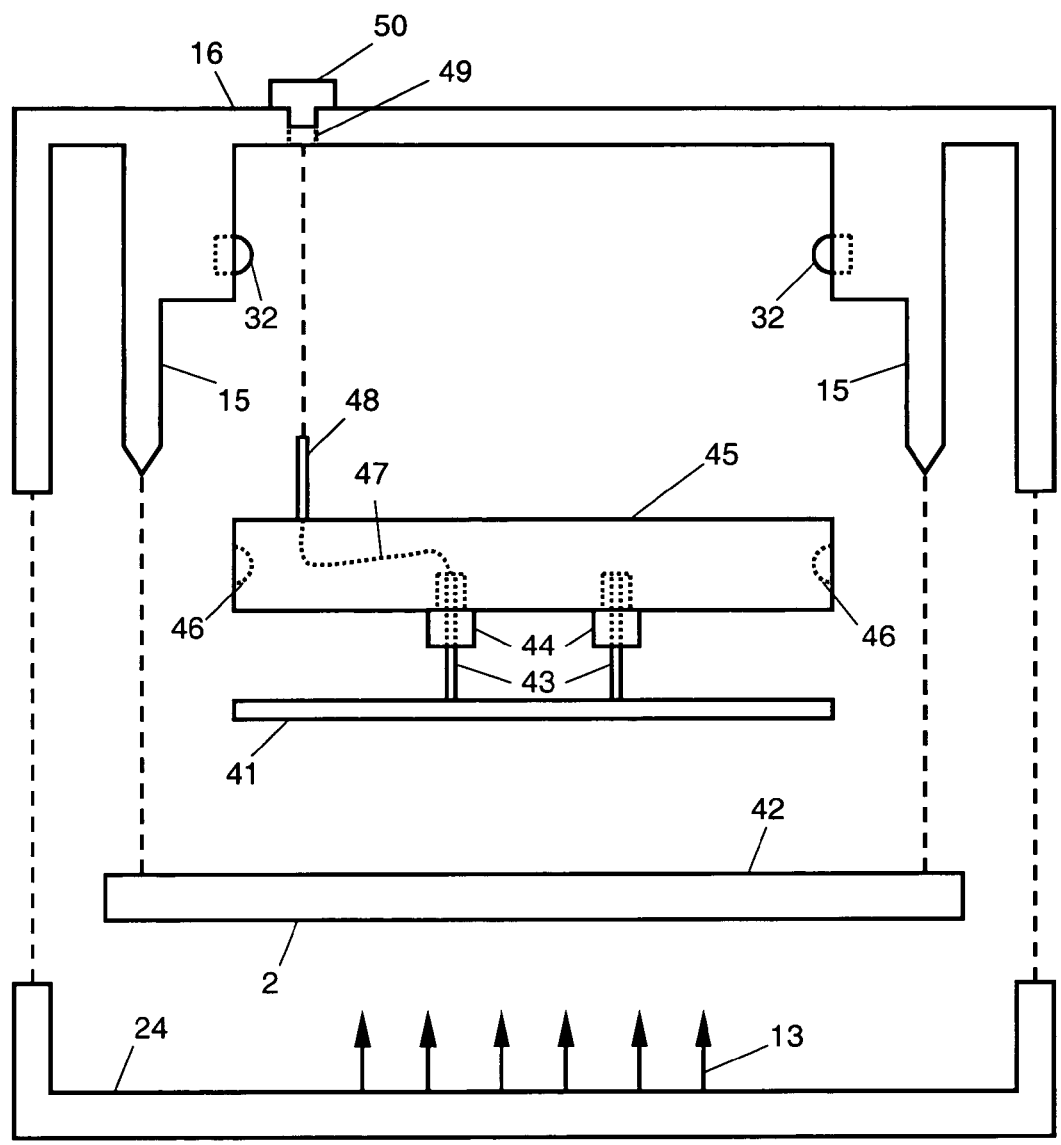
FIG. 3 illustrates a mechanical system for a circuit tester, for use with a unit under test without a heat sink.

FIG. 3 shows a basic schematic of a mechanical system for a circuit tester, for use with a UUT 2 without a heat sink.

There are similarities between the tester embodiment of FIG. 2 (UUT has a heat sink) and FIG. 3 (UUT has no heat sink). When the heat sink 31 is present (FIG. 2), prior to any tests, a removable, spring-loaded internal heat sink 33 is attached to the vacuum box 16, and may be swapped out for one of a different size, if required. In FIG. 3, where the heat sink is absent, an analogous group of removable, spring-loaded components is brought into contact with the UUT 2 while the tests are performed. In this case, a module, or contact element, 41 may perform various electrical tests on the top side 42 of the UUT 2, while the probes 13 perform tests on the side opposite the top side 42.

The module 41 may have built-in circuitry and may perform electrical tests similar to those performed by the probes 13, or may perform more simplistic tasks, such as checking the properties of some discretely mounted components, such as capacitors and resistors on the UUT 2. The module 41 may be a commercially available test module, such as TestJet Assembly, available from Hewlett-Packard, or may be a custom circuit. Additionally, the module 41 may contain elements that locally measure or locally control temperature on the top side 42 of the UUT 2. Temperature measurements are routinely performed with thermocouples, which are well-known in the art. The temperature may be locally controlled by a thermoelectric cooler, which uses the Peltier effect to redistribute heat when a current is applied. Typically, a thermoelectric cooler is designed as a plate, and when a current is run through the plate, one side of the plate gets cooler, and the other gets warmer. (Note that the plate only produces local cooling; if we sum the heat contributions from both sides of the plate, we find that globally, a net amount of heat is generated when a current is run through the plate. A plate that produced only cooling would violate the laws of thermodynamics.)

The module is permanently attached to a series of receptacles, or length-adjustable linkages, 43. The receptacles 43 are generally spring-loaded (i.e., containing a biasing element, such as a spring) and electrically conductive, and are similar in composition to the probes 13. The receptacles intimately engage the module 41 to the UUT 2, in other words, they are brought into thermal and/or electrical and/or mechanical contact with each other. The receptacles 43 are generally commercially available from the same companies that manufacture the probes 13, such as QA Technologies, Everett Charles Technology, Ingun, Interconnect Devices Inc., and Ostby Barton.

The receptacles 43 are removably inserted into a series of extender plugs 44. The extender plugs 44 are press-fit into a block, or mounting element, 45. The block 45 and the extender plugs 44 are generally neither electrically nor thermally conducting, and function primarily as sturdy mounts for the receptacles 43 and the module 41. Generally, the block 45 is manufactured from an epoxy fiberglass G10 or FR4, although any nonconductive material is suitable. The extender plugs 44 are typically manufactured from Delrin, although other suitable materials include but are not limited to acrylic, polycarbonate, PVC, and epoxy fiberglass. The socket retention forces vary between materials and should be considered in fixture design. Note that the extender plugs, or linkages, 44 may also include telescoping pins, springs with an associated supporting rod, and so forth.

The block 45 contains a series of holes 46, which engage with a series of ball detents 32 when the block is removably attached to the vacuum box 16. In comparison with the embodiment of FIG. 2, the block 46 is analogous to the internal heat sink 33, in that both parts are available in multiple sizes and are readily removable if the UUT 2 is dimensioned unusually. Note that when the block 45 is attached, it is generally attached rigidly; the receptacles 43 are spring-loaded, so the module 41 may be held firmly against the top side 42 of the UUT 2 without damage or loss of contact. Preferably, the block 45 is engaged by a snap fit engagement. Note that the location of the holes and ball detents may be reversed, with the ball detents on the block 45 and the holes in the vacuum box 16. The block may also engage in a push/turn assembly.

The block 45 may contain at least one wire 47, which electrically connects a receptacle 43 with a travel probe 48. When the block 45 is attached to the vacuum box 16, the travel probe 48 extends through a port 49 in the vacuum box 16 and makes electrical contact with an electrical contact pin 50. The electrical contact pin 50 may be connected with controlling circuitry external to the vacuum box 16. There may be multiple wires 47, travel probes 48, ports 49, and external contact pins 50, as needed. It is understood that the port 49 may not extend all the way through the vacuum box 16, but extend only as far as required to make contact with the electrical contact pin 50, which may be sealed by solder in the wall of the vacuum box 16.

Once the block 45 is attached to the vacuum box 16, the tester 1 is ready to test parts. A UUT 2 is removably attached to a series of fingers 15, and slightly compresses the spring-loaded receptacles 43, bringing the module 41 into contact with the top side 42 of the UUT 2. The interior of the vacuum box 16 is evacuated, and a series of probes 13 on a probe plate 24 is brought into electrical contact with the UUT 2. The tests are performed, then the vacuum is released, the vacuum box 16 and probe plate 24 separate, the probes 13 become spaced apart from the UUT 2, and the UUT 2 may be removed.

For the embodiment of FIG. 3, in which the UUT 2 is not attached to a heat sink, the fixture 3 (of FIG. 1) includes the vacuum box 16, the fingers 15, the ball detents 32, the module 41, the receptacles 43, the extender plugs 44, the block 45, the wires 47, the travel probes 48 and the electrical contact pins 50. The bed 4 (of FIG. 1) includes the probe plate 24 and the probes 13.

It is claimed:

1. A heat sinking test jet for use in a circuit tester housed within an airtight enclosure, the circuit tester having a top surface with a portion of the top having a recessed receiving area therein said recessed area extending into said top surface, a bed for a circuit board under test, the test jet intended to contact at least one component on a circuit board on the bed the test jet comprising:
   a) a mounting element sized to be releasably received within said recessed area and extending generally orthogonally away from said top surface in order to contact at least one component on said circuit board when under test;
   b) a contact surface attached to said mounting element and capable of contacting a component on said circuit board under test; and
   c) length adjustable linkage on said test jet capable of altering the distance between said mounting element and said contact surface so that, said mounting element intimately engages said component irrespective of the height of said component.

2. The test jet of claim 1 wherein said linkage includes at least one shaft connecting said mounting element and said contact surface and a bias element configured to provide a bias force against said mounting element, thereby insuring intimate contact between said mounting element and said circuit board under test.

3. The test jet of claim 2 wherein said adjustable linkage includes a shaft extending from through said top surface to a point external to said circuit tester and a heat radiator affixed to said shaft and likewise external to said circuit tester and wherein said shaft has a first end in contact with said mounting element and a second end connected to said heat radiator.

4. The test jet of claim 3 wherein said shaft includes a seal with said top surface for maintaining a vacuum between said top surface and said shaft.

5. The test jet of claim 1 wherein said linkage includes at least one element which telescopes to varying lengths.

6. The test jet of claim 1 wherein said mounting element engages said recessed receiving area in said top in a snap fit engagement.

7. The test jet of claim 6 wherein said snap fit engagement includes detents which maintain said recessed receiving area and mounting element in biased engagement when in place.

8. The test jet of claim 7 wherein said detents are ball detents extending outwardly from said mount and wherein said recessed receiving area includes notches to receive said detents.

9. The test jet of claim 6 wherein said snap fit engagement includes notches on said recessed receiving area and wherein said recessed receiving area engages surfaces of said mount and is locked into place by turning of said mount relative to said recessed receiving area.

10. The test jet of claim 1, wherein said adjustable length linkage includes a spring bias element which is capable of contracting in length when said circuit board under test is engaged by said test jet.

11. The test jet of claim 1 wherein said contact surface includes a sensor for measuring temperature of a component on the circuit board under test.

12. The test jet of claim 1 wherein said contact surface includes an electrical probe for making measurements of electrical contacts on said circuit board under test.

13. The test jet of claim 1 wherein of the element includes a radiating heat sink outside of the enclosure.

* * * * *